(12) United States Patent
Lu

(10) Patent No.: US 7,943,857 B2
(45) Date of Patent: May 17, 2011

(54) SLICED ELECTROMAGNETIC CAGE FOR INDUCTORS

(75) Inventor: Eric Chiyuan Lu, San Jose, CA (US)

(73) Assignee: Ralink Technology Corporation, Jhubei (TW)

( * ) Notice: Subject to any disclaimer, the term of this patent is extended or adjusted under 35 U.S.C. 154(b) by 91 days.

(21) Appl. No.: 12/015,468

(22) Filed: Jan. 16, 2008

(65) Prior Publication Data
US 2009/0178833 A1 Jul. 16, 2009

(51) Int. Cl.
*H05K 1/16* (2006.01)
(52) U.S. Cl. .......................... 174/260; 174/384
(58) Field of Classification Search .......... 174/260, 174/258, 376, 384, 387; 361/760, 800, 818, 361/660, 816, 701–711
See application file for complete search history.

(56) References Cited

U.S. PATENT DOCUMENTS

| | | | | |
|---|---|---|---|---|
| 4,340,770 A | * | 7/1982 | Bridges et al. | 174/350 |
| 4,758,922 A | * | 7/1988 | Ishigaki et al. | 361/330 |
| 6,437,653 B1 | * | 8/2002 | Cruz et al. | 331/181 |
| 6,777,620 B1 | * | 8/2004 | Abe | 174/255 |
| 6,867,475 B2 | * | 3/2005 | Yoshimura | 257/531 |
| 7,061,072 B2 | * | 6/2006 | Blanchard et al. | 257/531 |
| 7,518,067 B2 | * | 4/2009 | Gupta et al. | 174/376 |
| 2003/0117787 A1 | * | 6/2003 | Nakauchi | 361/818 |
| 2005/0225958 A1 | * | 10/2005 | Lewis | 361/818 |
| 2009/0243034 A1 | * | 10/2009 | Stribley et al. | 257/531 |

OTHER PUBLICATIONS

Behbahani et al., CMOS Mixers and Polyphase Filters for Large Image Rejection, IEEE Journal of Solid-State Circuits, Jun. 2001, pp. 873-887, vol. 36, No. 6.

* cited by examiner

*Primary Examiner* — Yuriy Semenenko
(74) *Attorney, Agent, or Firm* — Sawyer Law Group, P.C.

(57) ABSTRACT

A system within a circuit is disclosed. The system comprises a first shield and a device above the first shield. The system also includes a plurality of conductive walls coupled to and extending from the first shield to block electromagnetic (EM) waves to other parts of the circuit. A system and method in accordance with the present invention adds metal walls on the edge of a sliced shield. The walls block the electromagnetic wave from coupling to other parts of the circuit from a sideways direction.

2 Claims, 2 Drawing Sheets

SLICED ELECTROMAGNETIC CAGE FOR INDUCTORS

FIELD OF THE INVENTION

The present invention relates generally to integrated circuits and more specifically to minimizing losses when utilizing inductors in such circuits.

BACKGROUND OF THE INVENTION

Inductors are utilized extensively in a variety of integrated circuits. FIGS. 1A and 1B illustrate a top and side view of an inductor 12 with metal shielding 14 underneath on top of a substrate 18. Shielding 14 is added under the inductor 12 to move other circuits farther away from the inductor and also to prevent eddy currents and couplings to external circuits and lines. But even with the shielding 14 underneath the inductor, routing traces nearby (like power lines 16, and signal traces 20) still degrade the performance of the integrated circuit. At the present time, layout engineers use spacing to separate the inductor from the other parts of the integrated circuit or device from another. Engineers don't know ahead of time which device or devices is going to be next to the inductor, so they leave space to make sure the devices are completely separated as much as possible. The spacing can be 40 to 60 microns between devices.

The factor of spacing between devices or circuits is important. At present, layout engineers leave "keep out" areas between devices or circuits. This is to prevent coupling between devices or circuits. It is especially critical because layout engineers do not necessarily know which device or devices may be next to others. The current spacing is between 40 microns to 60 microns. As integrated circuits become smaller this spacing requirements becomes unacceptable.

In addition, even when the inductor is separated from the other parts of the integrated circuit in this manner, there is still the possibility of eddy current and direct coupling from the lossy substrate and metal traces nearby, which may come in from sideways, beneath, or on top. Eddy current, is caused when a magnetic field intersects a conductor.

At present, there is a need for sufficient empty space, both sideways and on top, between the inductor and any other routings. Otherwise, the quality factor of planar inductor suffers from electromagnetic losses due to eddy current and direct coupling from lossy substrate and metal traces nearby. Thus the inductor Q factor has degradation due to compact IC layout.

Accordingly, what is desired is a method to further reduce the spacing between devices, and also to reduce the possibility of eddy current and direct coupling from lossy substrate and metal traces nearby. The present invention addresses such a need.

SUMMARY OF THE INVENTION

A system within a circuit is disclosed. The system comprises a first shield and a device above the first shield. The system also includes a plurality of conductive walls coupled to and extending from the first shield to block electromagnetic (EM) waves to other parts of the circuit.

A system and method in accordance with the present invention adds metal walls on the edge of a sliced shield. The walls block the electromagnetic wave from coupling to other parts of the circuit from a sideways direction. The use of this structure allows for more compact layout placement with insignificant degradation.

DETAILED DESCRIPTION OF PREFERRED EMBODIMENTS

The present invention relates generally to integrated circuits and more specifically to minimizing losses when utilizing devices in such circuits. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 1A:
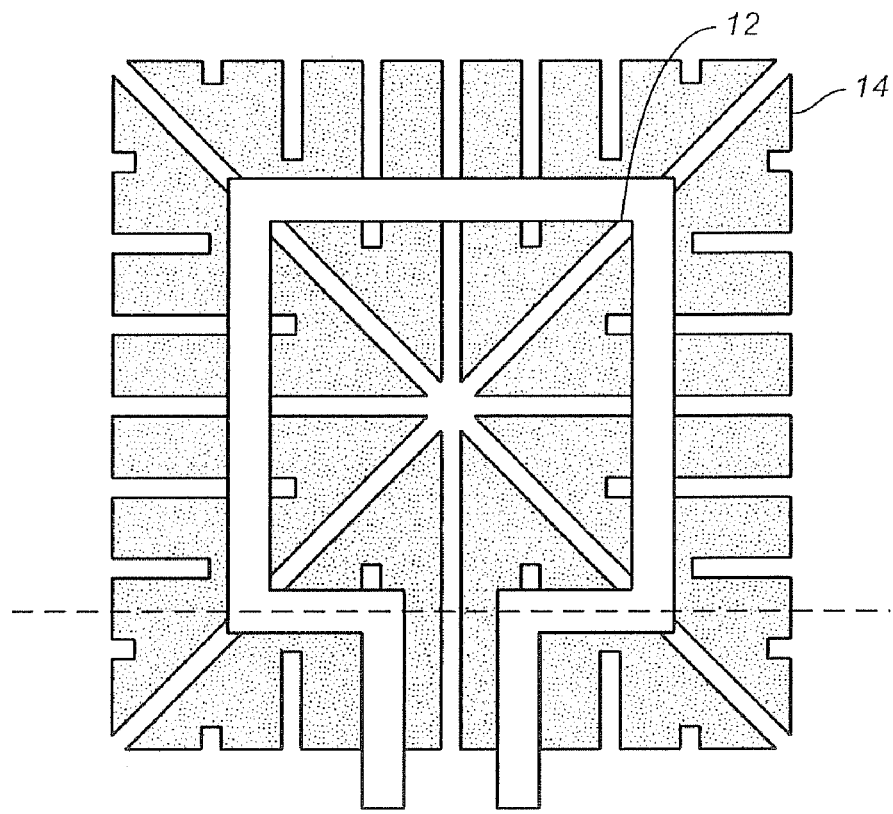
FIG. 1A illustrates a top view of an inductor with metal shielding underneath on top of a substrate.
Figure 1B:
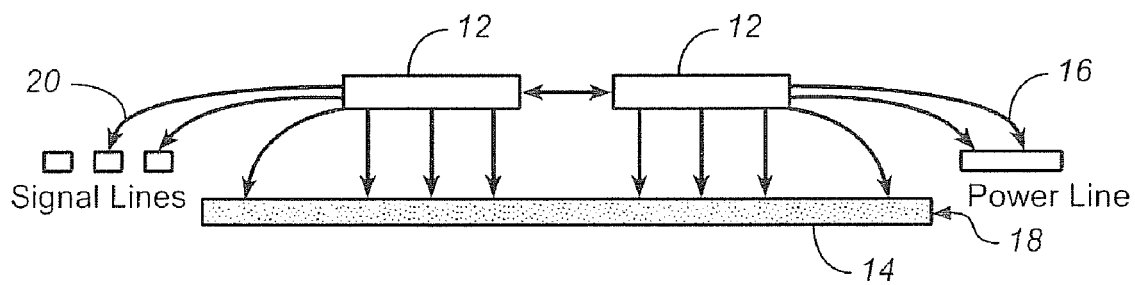
FIG. 1B illustrates a side view of an inductor with metal shielding underneath on top of a substrate.
Figure 2:
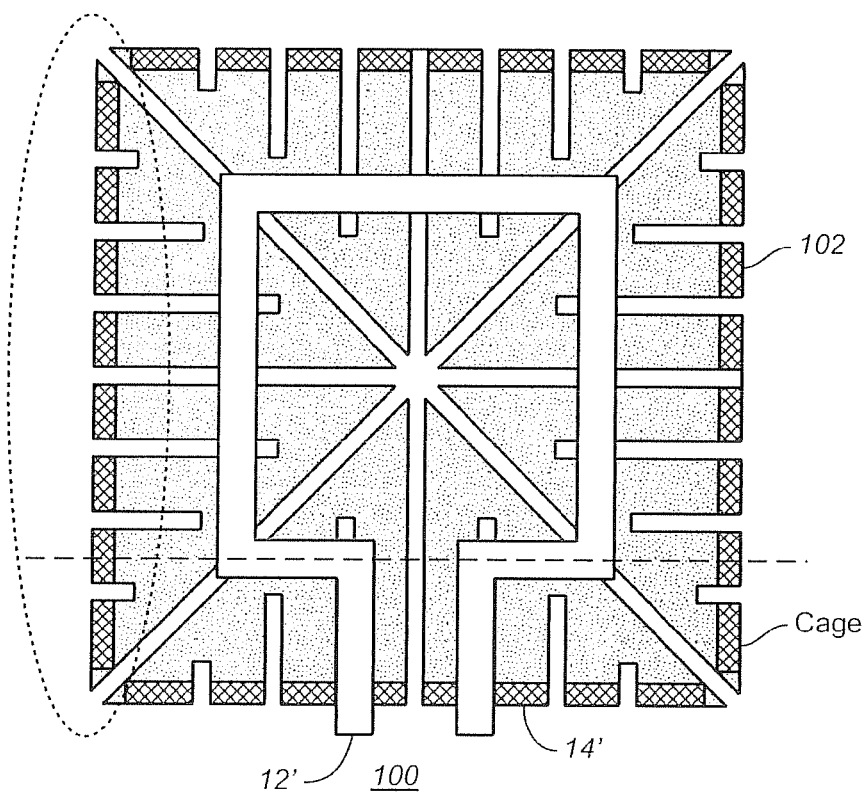
FIG. 2 shows a top view of a first embodiment of the present invention.
Figure 3:
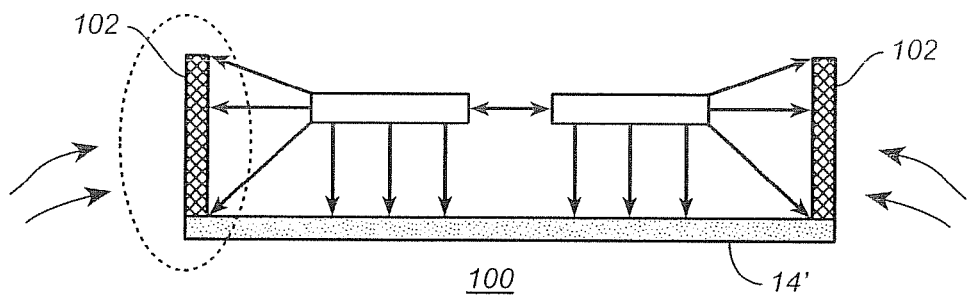
FIG. 3 shows a cutaway side view of the first embodiment of FIG. 2.

In a system and method in accordance with the present invention the electromagnetic (EM) wave seen by a lossy wafer substrate and the nearby routing is blocked more completely than with conventional systems. FIG. 2 shows a first embodiment of a shielding system 100 in accordance with the present invention. The shielding system in accordance with the present invention will described in the context of shielding an inductor but one of ordinary skill in the art readily recognizes that this system could utilized with a variety of devices and that use would be within the spirit and scope of the present invention. As shown in FIG. 2, highly conductive walls 102 are added to the ends of each sliced bottom shielding 14' and extend upward therefrom. The highly conductive walls may be made from example, stacked metal layers and vias. The conductive walls 102 are connected to the shielding 14' to block EM waves from moving sideways. This first embodiment is especially relevant when there are not many layers and/or space is very limited. FIG. 3 is a cutaway side view of the embodiment of FIG. 2. This view illustrates that the EM waves do not penetrate the walls 102.

Figure 4:
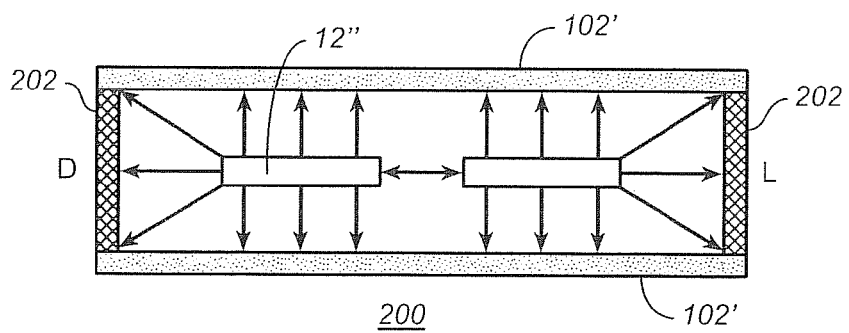
FIG. 4 shows a second embodiment of a shielding system in accordance with the present invention.

FIG. 4 shows a second embodiment of a shielding system 200 in accordance with the present invention. As shown, to confine the EM wave even more, another shield 202 is added to the top of the inductor 12". The top and bottom shields 202 and 14" are connected with the conductive walls 102'. The result is a fully covered cage for the inductor with the best possible isolation.

The top shield 202 as well as the bottom shield 14" is sliced. The sliced cage system 200 absorbs and arrests the electromagnetic wave emitted by inductor 12". The sliced cage system 200 also reduces coupling from nearby power and signal routings. The sliced cage system 200 isolates interference and confines the EM wave within the cage.

The present invention adds metal walls on the edge of sliced shielding material. The walls block the electromagnetic wave from coupling from a sideways direction. The use of this structure allows for more compact layout placement with insignificant degradation.

Advantages

A system and method in accordance with the present invention adds metal walls on the edge of a sliced shield. The walls block the electromagnetic wave from coupling to other parts of the circuit from a sideways direction. The use of this structure allows for more compact layout placement with insignificant degradation.

In a system and method in accordance with the present invention, the space between devices or circuits is reduced, thereby increasing the area that can be utilized for circuitry by 20-40 percent over conventional layouts.

In addition a system and method in accordance with the present invention suppresses the degradation due to nearby routing traces. As a result, we do not need a wide area for inductor placement. The result leads to a much more compact die size without sacrificing performance.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A shielding system on an integrated circuit comprising:
a sliced bottom shield;
an inductor above the sliced bottom shield; and
a plurality of highly conductive sliced walls extending from the sliced bottom shield to block electromagnetic waves from the inductor to other parts of the integrated circuit.

2. The shielding system of claim 1 including a top shield coupled to the extending conductive sliced walls above the inductor for blocking the EM waves.

* * * * *